United States Patent
Chia et al.

(10) Patent No.: US 9,585,283 B2
(45) Date of Patent: Feb. 28, 2017

(54) HIGH INSERTION FORCE EJECTOR

(71) Applicant: Cisco Technology, Inc., San Jose, CA (US)

(72) Inventors: Vic Hong Chia, Sunnyvale, CA (US); Mandy Hin Lam, Fremont, CA (US); Frank Jun, San Jose, CA (US); Hong Tran Huynh, Fremont, CA (US)

(73) Assignee: Cisco Technology, Inc., San Jose, CA (US)

( * ) Notice: Subject to any disclaimer, the term of this patent is extended or adjusted under 35 U.S.C. 154(b) by 417 days.

(21) Appl. No.: 13/728,115

(22) Filed: Dec. 27, 2012

(65) Prior Publication Data

US 2014/0187068 A1   Jul. 3, 2014

(51) Int. Cl.
*H01R 13/62* (2006.01)
*H05K 7/14* (2006.01)
*H01R 13/629* (2006.01)

(52) U.S. Cl.
CPC ..... *H05K 7/1489* (2013.01); *H01R 13/62933* (2013.01); *H01R 13/62938* (2013.01); *H01R 13/62966* (2013.01); *H01R 13/62972* (2013.01); *H01R 13/62977* (2013.01); *Y10T 29/49117* (2015.01)

(58) Field of Classification Search
CPC ............ H05K 7/1489; H01R 13/62977; H01R 13/62966; H01R 13/62972; H01R 13/62938; H01R 13/62933
USPC ........................................ 439/152, 153, 157
See application file for complete search history.

(56) References Cited

U.S. PATENT DOCUMENTS

| | | | | |
|---|---|---|---|---|
| 4,648,009 A | * | 3/1987 | Beun et al. ................... | 361/759 |
| 4,875,867 A | * | 10/1989 | Hoo .............................. | 439/157 |
| 5,414,594 A | * | 5/1995 | Hristake ....................... | 439/153 |
| 6,373,713 B1 | * | 4/2002 | Jensen et al. ................. | 439/153 |
| 6,915,562 B2 | * | 7/2005 | Joist et al. ...................... | 29/758 |
| 7,165,984 B1 | * | 1/2007 | Behrens et al. .............. | 439/157 |

* cited by examiner

*Primary Examiner* — Felix O Figueroa
(74) *Attorney, Agent, or Firm* — Merchant & Gould P.C.

(57) ABSTRACT

A high insertion force ejector is provided. The high insertion force ejector includes an ejector mounting base, a pressure bar-ejector tooth, a first cam, and a second cam. The pressure bar-ejector tooth is connected to the ejector mounting base. A lever handle is operatively connected to the pressure bar-ejector and the ejector mounting base. The first cam and the second cam are operatively connected to the pressure bar-ejector tooth and the lever handle.

26 Claims, 5 Drawing Sheets

HIGH INSERTION FORCE EJECTOR

BACKGROUND

Network infrastructures include servers and routers. The servers and routers may comprise a system chassis. A plurality of line cards may be installed in the system chassis. The system chassis and the plurality of line cards may each comprise a plurality of connection points.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1:
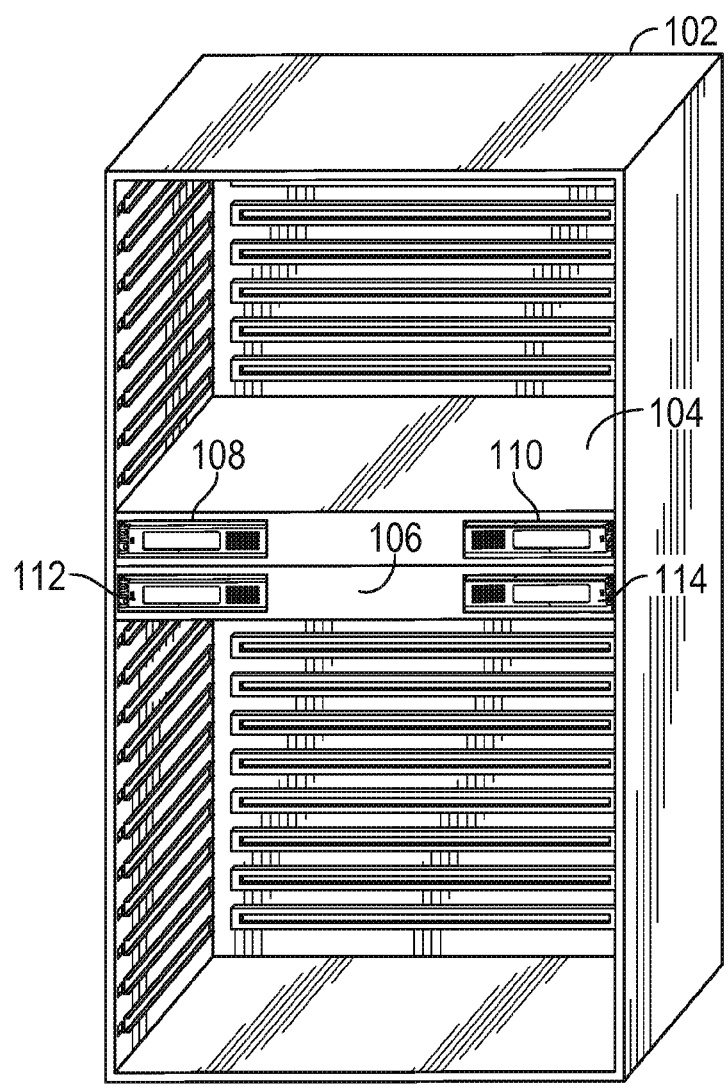
FIG. 1 shows a system chassis and line cards.

A high insertion force ejector is disclosed. The high insertion force ejector may comprise an ejector mounting base, a pressure bar-ejector tooth, a first cam, and a second cam. The pressure bar-ejector tooth may be connected to the ejector mounting base. A lever handle may be operatively connected to the pressure bar-ejector and the ejector mounting base. The first cam and the second cam may be operatively connected to the pressure bar-ejector tooth and the lever handle.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Line cards may be installed in a system chassis. Due to increases in bandwidth and number of users requiring network connections, there may be an increase in the number of connection points between a line card and the system chassis. The increased number of connection points may cause a greater resistance when the line cards are installed in the system chassis or removed from the system chassis.

Installing line cards within the system chassis may comprise using a lever to increase a mechanical advantage. The lever may increase a mechanical advantage to convert an input force supplied by a user to an insertion force. In other words, the input force may be multiplied by the lever to result in the insertion force being much larger than the input force. For example, using a dual cam lever, an input force ranging from 10 pounds to 20 pounds may result in an insertion force ranging from 400 pounds to 500 pounds.

FIG. 1 shows a system chassis 102 comprising a first line card 104 and a second line card 106. While FIG. 1 shows system chassis 102 having two line cards, system chassis 102 may comprise any number of line cards. First line card 104 and second line card 106 may be inserted and removed from system chassis 102. During insertion, connectors (not shown) located on the back of each line card may engage corresponding connectors (not shown) located on a backplane of system chassis 102.

Inserting the line cards (i.e. first line card 104 and second line card 106) may require a user to apply an insertion force in excess of 350 to 400 pounds. To assist the user in generating the appropriate insertion force, each line card may include a high insertion force ejector. For example, first line card 104 may include a first high insertion force ejector 108 and a second high insertion force ejector 110. Second line card 106 may include a third high insertion force ejector 112 and a fourth high insertion force ejector 114.

Figure 2:
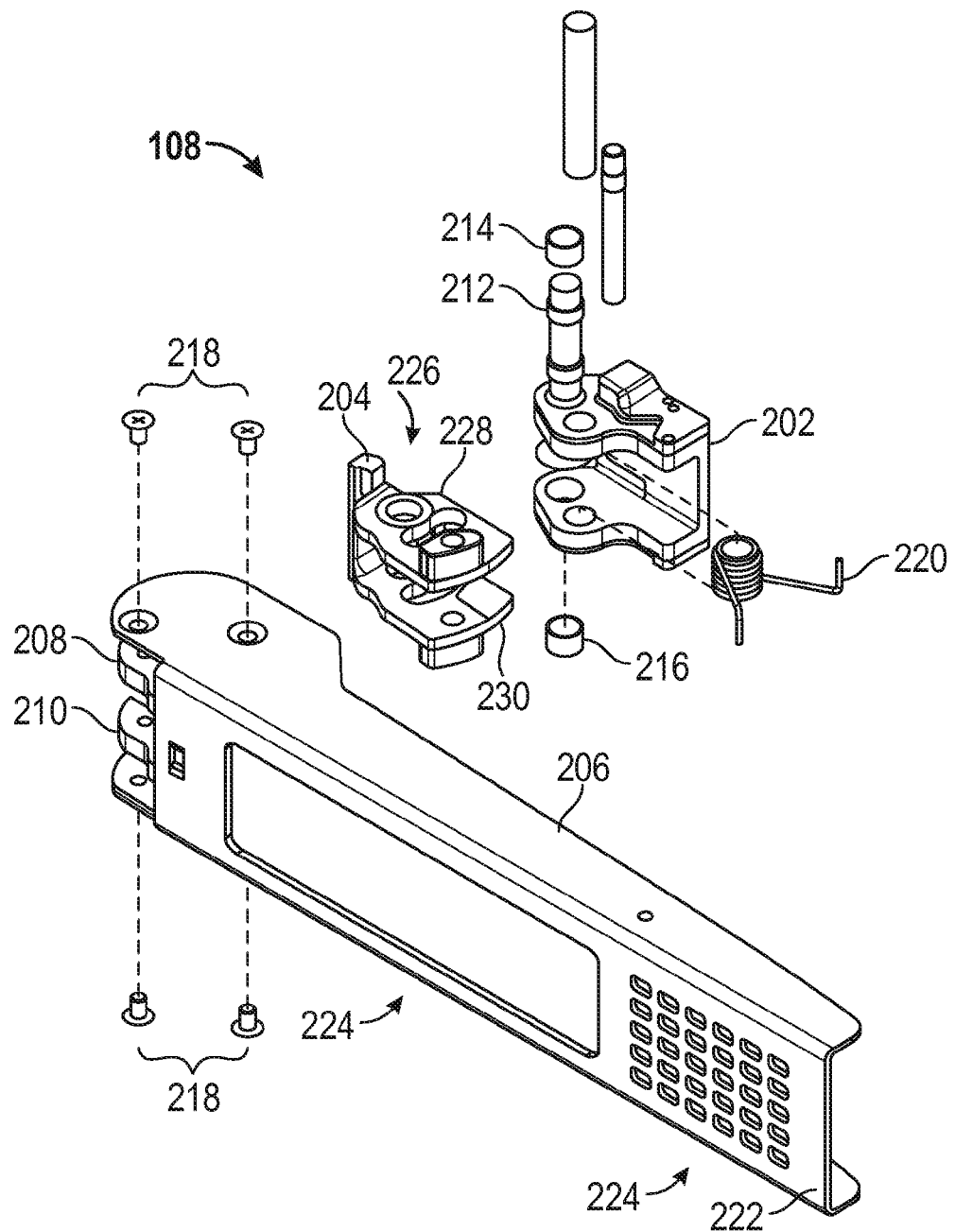
FIG. 2 shows an assembly drawing of a high insertion force ejector.

FIG. 2 shows an assembly drawing of first high insertion force ejector 108. Second high insertion force ejector 110, third high insertion force ejector 112, and fourth high insertion force ejector 114 may be constructed similarly. First high insertion force ejector 108 may comprise an ejector mounting base 202, a pressure bar-ejector tooth 204, a lever handle 206, a first cam 208, and a second cam 210. Pressure bar-ejector tooth 204 may be disposed on a pressure bar-ejector tooth assembly 226. Pressure bar-ejector tooth assembly 226 may comprise a pressure bar-ejector tooth assembly upper portion 228 and a pressure bar-ejector tooth assembly lower portion 230 that may be substantially parallel to pressure bar-ejector tooth assembly upper portion 228. As shown in FIG. 2, pressure bar-ejector tooth 204 may be substantially perpendicular to lever handle 206, pressure bar-ejector tooth assembly upper portion 228, and pressure bar-ejector tooth assembly lower portion 230. Also as shown in FIG. 2, pressure bar-ejector tooth 204 may be attached to an end of pressure bar-ejector tooth assembly upper portion 228 and to an end of the pressure bar-ejector tooth assembly lower portion 230. A pivot pin 212 may pass through ejector mounting base 202 and pressure bar-ejector tooth assembly 226. A first bearing 214 and a second bearing 216 may be used to reduce friction as lever handle 206 and pressure bar-ejector tooth assembly 226 move.

Ejector mounting base 202 may be attached to first line card 104. Pressure bar-ejector tooth assembly 226 may be connected to ejector mounting base 202. Lever handle 206 may be operatively connected to pressure bar-ejector assembly 226 and ejector mounting base 202. For example, pivot pin 212 may pass through ejector mounting base 202, pressure bar-ejector tooth assembly 226, first cam 208, and second cam 210. Lever handle 206 may be connected to first cam 208 and second cam 210 with a plurality of screws 218.

A torsion spring 220 may be connected to ejector mounting base 202 and lever handle 206. Torsion spring 220 may apply a small force to lever handle 206. The small force may cause a portion of lever handle 206 furthest from first cam 208 and second cam 210 to project away from first line card 104. Lever handle 206, projecting from first line card 104 may assist the user in inserting first line card 104 into system chassis 102 by securing pressure bar-ejector tooth 204 in an angle position to clear system chassis 102. The small force applied by torsion spring 220 may be negligible compared to an input force applied by the user. Lever handle 206 may have a shape and size that does not protrude from system chassis 102 when first line card 104 is installed in system chassis 102.

During insertion of first line card 104, the user may apply the input force to lever handle 206. First cam 208 and second cam 210 may be operative to convert the input force received at lever handle 206 into an insertion force. For example, lever handle 206 may pivot about pivot pin 212, thus the input force may create a moment about pivot pin 212. Pressure bar-ejector tooth 204 may be connected to lever handle 206 and also may pivot about pivot pin 212. The input force may be applied at a greater distance from pivot pin 212 than the output force generated at pressure bar-ejector tooth 204. In other words, the moment generated by the input force may be balanced by a counter moment created by pressure bar-ejector tooth 204. Because pressure bar-ejector tooth 204's length may be shorter than lever handle 206's length, the counter moment created by pressure bar-ejector tooth 204 may result in a larger force being exerted by pressure bar-ejector tooth 204 on system chassis 102.

The mechanical advantage generated by first high insertion force ejector 108 may be calculated using the following formula:

$$(F_{insertion}) = \frac{(F_{input})(L_{pressure\ bar\ -\ ejector\ tooth\ 204})}{(L_{lever\ handle\ 206})}$$

Where:
$F_{insertion}$=the insertion force applied to system chassis 102 from pressure bar-ejector tooth 204,
$F_{input}$=the input force applied by a user,
$L_{pressure\ bar-ejector\ tooth\ 204}$=pressure bar-ejector tooth 204's length, and
$L_{lever\ handle\ 206}$=lever handle 206's length.

For example, assume lever handle 206 has a length of 11 inches, pressure bar-ejector tooth 204 has a length of 0.5 inches, and a user supplies an input force of 20 pounds. Using the above formula, the insertion force would be approximately 440 pounds. Therefore, the mechanical advantage would be approximately 20 to 1.

Pressure bar-ejector tooth 204 may be arranged to distribute the insertion force substantially evenly to system chassis 102. For example, the input force may be between 10 pounds and 20 pounds. Lever handle 206, first cam 208, second cam 210, and pressure bar-ejector tooth 204 may be arranged to convert the input force to an insertion force between 400 pounds and 500 pounds. Pressure bar-ejector tooth 204 may comprise a height that is approximately the same height as first line card 104. This may allow pressure bar-ejector tooth 204 to apply the insertion force evenly to system chassis 102 over a larger area, thus acting to minimize damage to system chassis 102.

For instance, lever handle 206 may have a length that is approximately 11 inches and may receive an input of 20 pounds. As described above, first high insertion force ejector 108 may convert the input force to an insertion force of approximately 440 pounds. The 440 pounds may be distributed across the face of pressure bar-ejector tooth 204. The surface area of pressure bar-ejector tooth 204 may be increased or decreased to achieve a desired pressure applied to system chassis 102.

The pressure applied to system chassis 102 may be calculated using the following formula:

$$(P_{system\ chassis\ 102}) = \frac{(F_{insertion})}{(A_{pressure\ bar\ -\ ejector\ tooth\ 204})}$$

Where:
$P_{system\ chassis\ 102}$=pressure applied to system chassis 102 from pressure bar-ejector tooth 204,
$F_{insertion}$=insertion force, and
$A_{pressure\ bar-ejector\ tooth\ 204}$=surface area of pressure bar-ejector tooth 204 in contact with system chassis 102.

For example, assume an insertion force of 440 pounds and a surface area of 1 square inch. Using the above formula, the pressure applied to system chassis 102 would be approximately 440 pounds per square inch (psi). Depending on design consideration, the surface area of pressure bar-ejector tooth 204 in contact with system chassis 102 may be increased or decreased. For instance, a maximum pressure may set at 350 psi and an anticipated insertion force may be set at 440 pounds. Therefore, the surface area of pressure bar-ejector tooth 204 may be set at a minimum of 1.25 square inches.

Pressure bar-ejector tooth 204 may apply the insertion force without causing a moment about first line card 104. For example, pressure bar-ejector tooth 204 may comprise a height approximately equal to first line card 104's height. First cam 208 may be located proximate a top edge of first line card 104 and second cam 210 may be located proximate a bottom edge of first line card 104. Having first cam 208 and second cam 210 offset from first line card 104's center and in conjunction with pressure bar-ejector tooth 204's height, may allow the pressure generated by first high insertion force ejector 108 to be applied evenly to system chassis 102. This may allow pressure bar-ejector tooth 204 to distribute the insertion force evenly across both first line card 104 and system chassis 102. Minimizing the moment applied to first line card 104 may assist in minimizing damage to first line card 104, system chassis 102, and connectors attached to both first line card 104 and system chassis 102. In addition, minimizing the moment applied to first line card 104 may assist in minimizing the possibility that first line card 104 may impact an adjacent line card (e.g., second line card 106) thereby minimizing possible damage to the adjacent line card.

Lever handle 206 may comprise a surface 222. Surface 222 may define a plurality of openings 224. Plurality of openings 224 may be operative to allow heat to be dissipated from first line card 104. For example, a fan located inside first line card 104 may cause air to flow through first line card 104. The air may exit first line card 104's front and pass through at least one of plurality of openings 224, thereby dissipating heat from first line card 104. In addition, lever handle 206 may operate as a heat sink. For instance, lever handle 206 may be constructed of a thermally conductive material (e.g., aluminum). The thermally conductive material may absorb heat generated by first line card 104 and allow the heat to be removed by natural and/or forced convection.

For instance, lever handle 206 may be manufactured from a material with a high thermal conductivity. The material may then absorb energy from air exiting first line card 104. Due to the high thermal conductivity, the lever handle 206 may be able to conduct the energy and disperse the energy over a greater surface area. Because heat transfer rates for convection are proportional to surface area, having the energy dispersed over a greater surface area may allow for greater convective (natural or forced) heat transfer. A second fan (not shown) may be located outside system chassis 102 and may create airflow across lever handle 206. The airflow may act to carry energy absorbed by lever handle 206 from lever handle 206 via forced convection. Furthermore, air exiting plurality of openings 224 may allow air exiting first line card 104 to directly carry energy away from first line card 104.

Figure 3:
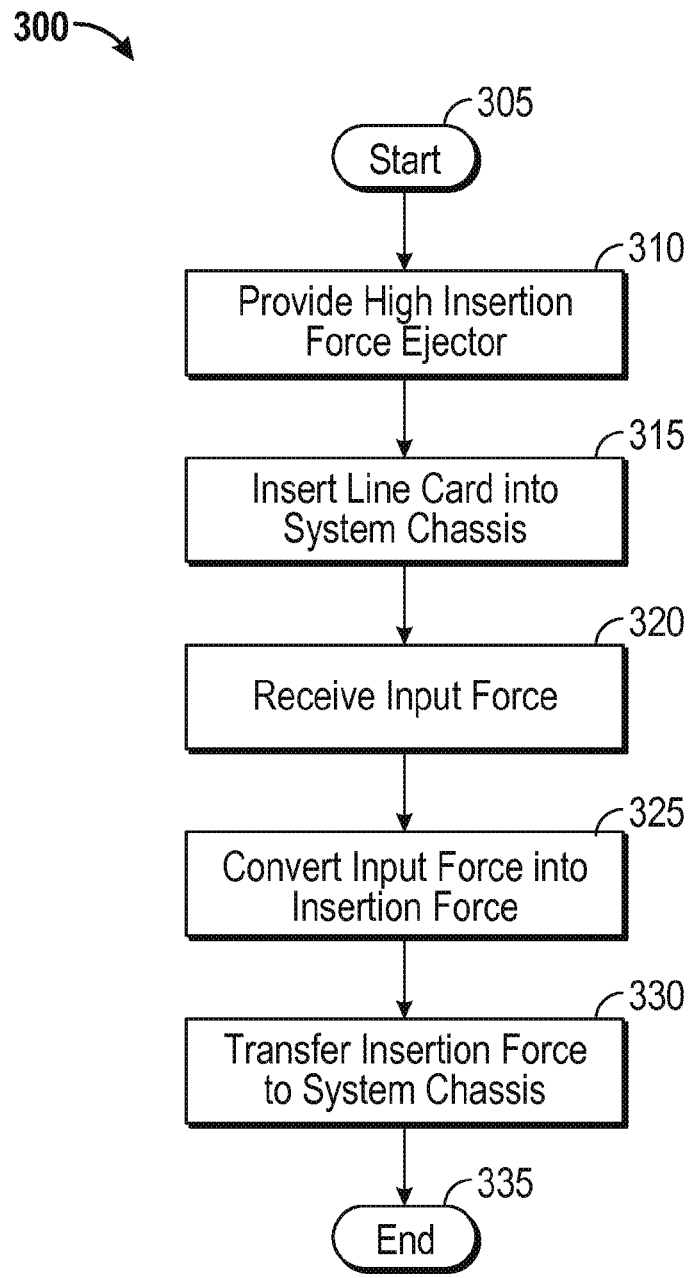
FIG. 3 shows a flowchart for a method for inserting a line card into a system chassis.
Figure 4A:
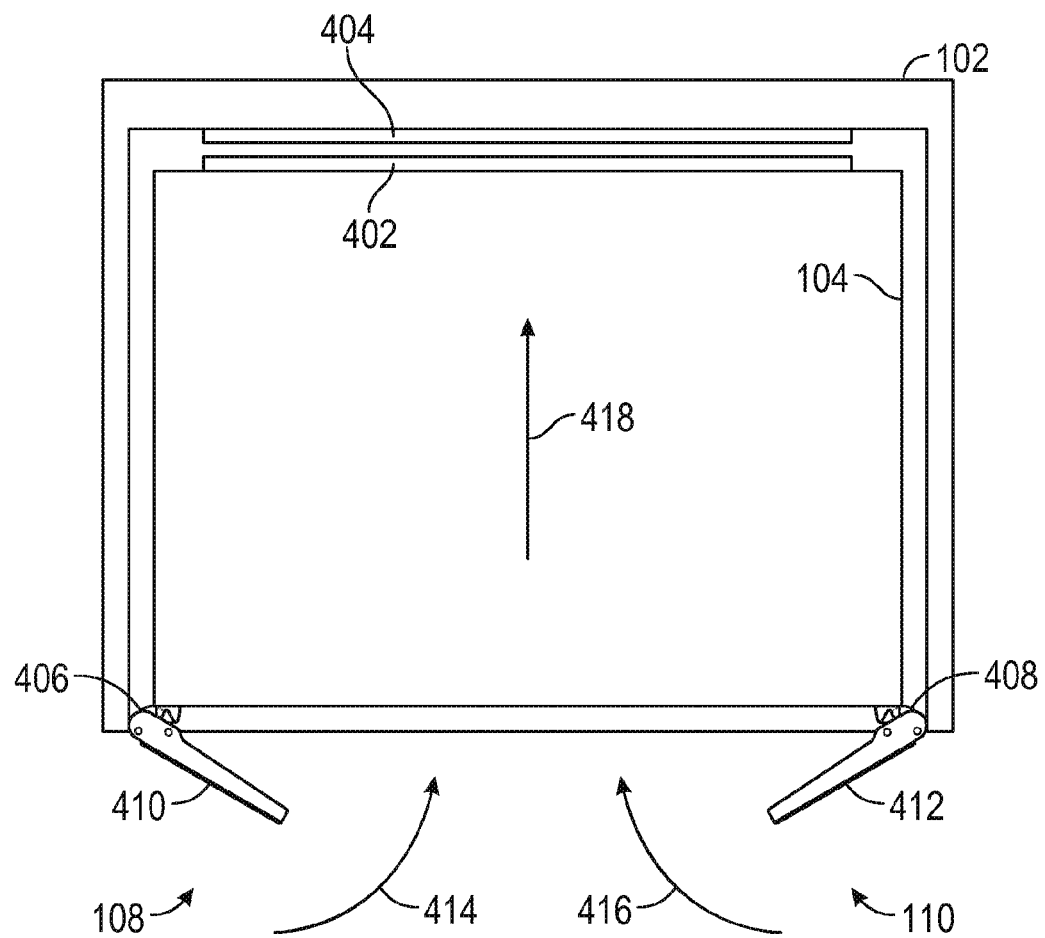
FIGS. 4A and 4B show a line card being inserted into a system chassis.
Figure 4B:
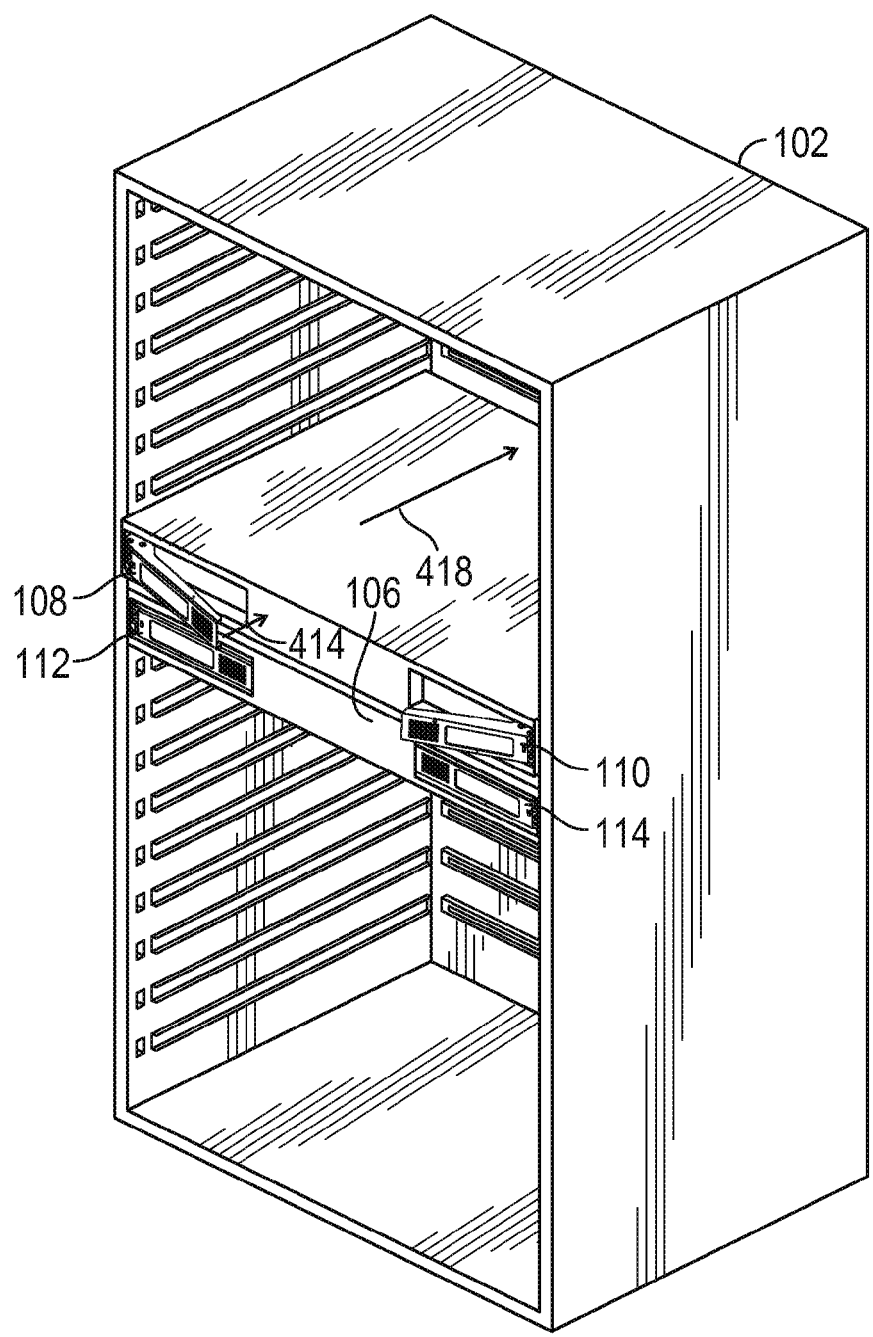

FIG. 3 shows a method 300 for inserting first line card 104 into system chassis 102. Method 300 may begin at stage 305 and proceed to stage 310 where first high insertion force ejector 108 may be provided. For example, as shown in FIGS. 4A and 4B, first high insertion force ejector 108 and second high insertion force ejector 110 may be attached to first line card 104.

From stage 310 where high insertion force ejector 108 is provided, method 300 may proceed to stage 315 where first line card 104 may be inserted into system chassis 102. During insertion, first line card 104 may be partially inserted into system chassis 102. A first plurality of connectors 402 may protrude from the back of first line card 104. First plurality of connectors 402 may mate with a second plurality of connectors 404 located on system chassis 102. A first pressure bar ejector tooth 406 (e.g., pressure bar ejector tooth 204) and a second pressure bar ejector tooth 408 (e.g., pressure bar ejector tooth 204) may contact system chassis 102.

From stage 315 where first line card 104 is inserted into system chassis 102, method 300 may proceed to stage 320 where input forces may be received at a first lever handle 410 and a second lever handle 412. For example, a user may apply a first input force to first lever handle 410. First lever handle 410 may comprise lever handle 206 as described above. The user may apply a second input force to second lever handle 412. Second lever handle 412 may comprise lever handle 206 as described above. The first input force and the second input force may be equal or they may be unequal. For instance, receiving the first input force may comprise receiving a force between 10 pounds and 20 pounds at first lever handle 410 and receiving the second input force may comprise receiving a force between 10 pounds and 20 pounds at second lever handle 412.

From stage 320 the input force is received, method 300 may proceed to stage 325 where the input force may be converted into an insertion force. For example, first high insertion force ejector 108 and second high insertion force ejector 110 may each comprise first cam 208 and second cam 210. Upon receiving the input forces, first cam 208 and second cam 210 may convert the input force ranging from 10 pounds to 20 pounds into insertion force ranging from 400 pounds and 500 pounds.

From stage 325 where the input force is converted to the insertion force, method 300 may proceed to stage 330 where pressure bar-ejector tooth 204 may transfer the insertion force to system chassis 102. For example, the first input force and the second input force may cause first lever handle 410 and second lever handle 412 to move in the directions indicated by arrows 414 and 416 respectively. As first lever handle 410 and second lever handle 412 move, the input forces may be converted to the insertion force. The insertion force may be transferred to system chassis 102 by first pressure bar ejector tooth 406 and second pressure bar ejector tooth 408 as they apply pressure to system chassis 102. The pressure may cause first line card 104 to move toward the rear of system chassis as indicated by arrow 418.

As first line card 104 travels in the direction of arrow 418, first plurality of connectors 402 may mate with second plurality of connectors 404.

From stage 330, method 300 may terminate at termination block 335. To remove first line card 104 from system chassis 102, first lever handle 410 and second lever handle 412 may be moved in directions opposite arrows 414 and 416. The resulting movement may cause first pressure bar ejector tooth 406 and second pressure bar ejector tooth 408 to apply pressure to system chassis 102. The applied pressure may cause first line card 104 to move in a direction opposite the direction of arrow 418. The resulting movement may cause first plurality of connectors 402 to disconnect from second plurality of connectors 404.

An embodiment may comprise a high insertion force ejector. The high insertion force ejector may comprise an ejector mounting base, a pressure bar-ejector tooth, a first cam, and a second cam. The pressure bar-ejector tooth may be connected to the ejector mounting base. A lever handle may be operatively connected to the pressure bar-ejector and the ejector mounting base. The first cam and the second cam may be operatively connected to the pressure bar-ejector tooth and the lever handle.

The lever handle may comprise a surface that may define at least one opening. The lever handle may be configured to receive an input force between 10 pounds and 20 pounds. The pressure bar-ejector tooth may be configured to deliver an output force of at least 500 pounds. The lever handle may have a length less than 11 inches. The high insertion force ejector may further comprise a line card. The ejector base may be connected to the line card. The pressure bar-ejector tooth may be configured to provide an insertion force without causing a moment about the line card. The high insertion force ejector may further comprise a torsion spring. The torsion spring may be operatively connected to the lever handle and the ejector mounting base. The lever handle may be configured to operate as a heat sink.

Another embodiment may comprise a line card, a first high insertion force ejector, and a second high insertion force ejector. The line card may comprise a first side and a second side. The first high insertion force ejector may be attached to the line card. The first high insertion force ejector may comprise a first ejector mounting base, a first pressure bar-ejector tooth, a first lever handle, and a pair of cams. The first ejector mounting base may be attached to the line card proximate the first side. The first pressure bar-ejector tooth may be connected to the first ejector mounting base. The first lever handle may be operatively connected to the first pressure bar-ejector and the first ejector mounting base. The first pair of cams may be operative to convert a first input force received at the first lever handle into a first insertion force. The second high insertion force ejector may be attached to the line card. The second ejector mounting base may be attached to the line card proximate the second side. The second pressure bar-ejector tooth may be connected to the second ejector mounting base. The second lever handle may be operatively connected to the second pressure bar-ejector and the second ejector mounting base. The second pair of cams may be operative to convert a second input force received at the first lever handle into a second insertion force.

The first lever handle and the second lever handle may each comprise a surface. Each surface may define at least one opening that may be operative to allow heat to be dissipated from the line card. The first input force and the second input force may each range from about 10 pounds to about 20 pounds. The first insertion force and the second insertion force may each range from about 400 pounds to about 500 pounds. The first lever handle and the second lever handle may each have a length less than 11 inches. The first pressure bar-ejector tooth and the second pressure bar-ejector tooth each may be configured to apply the insertion force without causing a moment about the line card.

Another embodiment may comprise a system chassis and a line card. An ejector mounting base may be attached to the line card. A pressure bar-ejector tooth may be connected to the ejector mounting base. The pressure bar-ejector may be arranged to distribute an insertion force evenly to the system chassis. A lever handle may be operatively connected to the pressure bar-ejector and the ejector mounting base. A first cam and a second cam may be operative to convert an input force received at the lever handle into the insertion force.

The lever handle may comprise a surface. The surface may define at least one opening operative to allow heat to be dissipated from the line card. The input force may be between 10 pounds and 20 pounds and the insertion force may be between 400 pounds and 500 pounds. The lever handle may have a length less than 11 inches. The pressure bar-ejector tooth may be configured to apply the insertion force without causing a moment about the line card. A torsion spring may be operatively connected to the lever handle and the ejector mounting base. The lever handle may be configured to operate as a heat sink. The lever handle may not protrude from the system chassis when the line card is installed in the system chassis.

Yet another embodiment may comprise a method. The method may comprise providing a high insertion force ejector; receiving an input force at the lever handle; and converting the input force into an insertion force. The high insertion force ejector may comprise a lever handle and a pressure bar-ejector tooth. The lever handle may be connected to the pressure bar-ejector tooth via a first cam and a second cam. The lever handle may have a length less than 11 inches. The input force may be converted via the first cam and the second cam.

Receiving the input force may comprise receiving a force between 10 pounds and 20 pounds. Converting the input force into the insertion force may comprise converting the input force into a force between 400 pounds and 500 pounds. The method may further comprise transferring the insertion force to a system chassis. Transferring the insertion force to the system chassis may comprise transferring the insertion force to the system chassis without causing a moment about a line card.

While certain embodiments of the disclosure have been described, other embodiments may exist. The included examples do not limit the disclosure's scope. The disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
   a line card having a front side;
   an ejector mounting base attached to the front side of the line card;
   a pressure bar-ejector tooth assembly connected to the ejector mounting base, the pressure bar-ejector tooth assembly having a pressure bar-ejector tooth assembly upper portion and a pressure bar-ejector tooth assembly lower portion substantially parallel to the pressure bar-ejector tooth assembly upper portion;
   a pressure bar-ejector tooth attached to an end of the pressure bar-ejector tooth assembly upper portion and to an end of the pressure bar-ejector tooth assembly lower portion, wherein the pressure bar-ejector tooth assembly upper portion and the pressure bar-ejector tooth assembly lower portion are spaced apart, wherein the pressure bar-ejector tooth continuously extends from beyond an end of the pressure bar-ejector tooth assembly upper portion to beyond an end of the pressure bar-ejector tooth assembly lower portion, the pressure bar tooth having a height approximately equal to a height of the front side of the line card, the pressure bar-ejector tooth is perpendicular to a lever handle, the pressure bar-ejector tooth assembly upper portion, and the pressure bar-ejector tooth assembly lower portion;
   the lever handle operatively connected to the pressure bar-ejector tooth assembly and the ejector mounting base;
   a first cam operatively connected to the pressure bar-ejector tooth assembly and the lever handle; and
   a second cam operatively connected to the pressure bar-ejector tooth assembly and the lever handle, the first cam and the second cam being offset from a center of the front side of the line card by equal amounts, wherein the first cam is located proximate a top edge of the line card and the second cam is located proximate a bottom edge of the line card.

2. The apparatus of claim 1, wherein the pressure bar-ejector tooth assembly comprises a pressure bar-ejector tooth assembly upper portion and a pressure bar-ejector tooth assembly lower portion being substantially parallel to the pressure bar-ejector tooth assembly upper portion, the pressure bar-ejector tooth being attached to an end of the pressure bar-ejector tooth assembly upper portion and to an end of the pressure bar-ejector tooth assembly lower portion.

3. The apparatus of claim 1, wherein the lever handle comprises a surface defining at least one opening.

4. The apparatus of claim 1, wherein the lever handle is configured to receive an input force from about 10 pounds to about 20 pounds and the pressure bar-ejector tooth is configured to deliver an output force from about 400 pounds to about 500 pounds.

5. The apparatus of claim 3, wherein the lever handle has a length of less than 11 inches.

6. The apparatus of claim 1, further comprising a line card, the ejector mounting base connected to the line card, the pressure bar-ejector tooth configured to provide an insertion force without causing a moment about the line card.

7. The apparatus of claim 1, further comprising a torsion spring operatively connected to the lever handle and the ejector mounting base.

8. The apparatus of claim 1, wherein the lever handle is configured to operate as a heat sink.

9. An apparatus comprising:
   a line card comprising a front side;
   a first high insertion force ejector attached to the line card, the first high insertion force ejector comprising:
   a first ejector mounting base attached to the line card proximate the front side,
   a first pressure bar-ejector tooth assembly connected to the first ejector mounting base, the first pressure bar-ejector tooth assembly having a pressure bar-ejector tooth assembly upper portion and a pressure bar-ejector tooth assembly lower portion, the pressure bar-ejector tooth assembly lower portion substantially parallel to and spaced from the pressure bar-ejector tooth assembly upper portion;

a first pressure bar-ejector tooth attached to an end of the pressure bar-ejector tooth assembly upper portion and to an end of the pressure bar-ejector tooth assembly lower portion, wherein the pressure bar-ejector tooth continuously extends from beyond an end of the pressure bar-elector tooth assembly upper portion to beyond an end of the pressure bar-elector tooth assembly lower portion, the pressure bar tooth having a height approximately equal to a height of the front side of the line card, the pressure bar-ejector tooth is perpendicular to a lever handle, the pressure bar-elector tooth assembly upper portion, and the pressure bar-elector tooth assembly lower portion, the first lever handle operatively connected to the first pressure bar-ejector tooth assembly and the first ejector mounting base; and a first pair of cams operative to convert a first input force received at the first lever handle into a first insertion force, the first pair of cams being offset from a center of the front side of the line card by equal amounts.

10. The apparatus of claim 8, further comprising:
a second high insertion force ejector attached to the line card, the second high insertion force ejector comprising:
a second ejector mounting base attached to the line card proximate the front side,
a second pressure bar-ejector tooth assembly connected to the second ejector mounting base, the second pressure bar-ejector tooth assembly having a second pressure bar-ejector tooth having a height approximately equal to the height of the front side of the line card,
a second lever handle operatively connected to the second pressure bar-ejector and the second ejector mounting base, the second pressure bar-ejector tooth being substantial perpendicular to the second lever handle, and
a second pair of cams operative to convert a second input force received at the second lever handle into a second insertion force, the second pair of cams being offset from the center of the front side of the line card by equal amounts.

11. The apparatus of claim 10, wherein the first lever handle and the second lever handle each comprise a surface, each surface defining at least one opening operative to allow heat to be dissipated from the line card.

12. The apparatus of claim 10, wherein the first input force and the second input force each range from about 10 pounds to about 20 pounds and the first insertion force and the second insertion force each range from about 400 pounds to about 500 pounds.

13. The apparatus of claim 10, wherein the first lever handle and the second lever handle each have a length less than 11 inches.

14. The apparatus of claim 10, wherein the first pressure bar-ejector tooth and the second pressure bar-ejector tooth each are configured to apply the insertion force without causing a moment about the line card.

15. An apparatus comprising:
a system chassis;
a line card installed to the system chassis;
an ejector mounting base attached to a front side of the line card;
a pressure bar-ejector tooth assembly connected to the ejector mounting base, the pressure bar-ejector tooth assembly having a pressure bar-ejector tooth assembly upper portion and a pressure bar-ejector tooth assembly lower portion substantially parallel to the pressure bar-ejector tooth assembly upper portion;

a pressure bar-ejector tooth arranged to distribute an insertion force to the system chassis, the pressure bar-ejector tooth attached to an end of the pressure bar-ejector tooth assembly upper portion and to an end of the pressure bar-ejector tooth assembly lower portion, wherein the pressure bar-ejector tooth assembly upper portion and the pressure bar-ejector tooth assembly lower portion are spaced apart, wherein the pressure bar-ejector tooth continuously extends from beyond an end of the pressure bar-ejector tooth assembly upper portion to beyond an end of the pressure bar-ejector tooth assembly lower portion, the pressure bar tooth having a height approximately equal to a height of the front side of the line card, the pressure bar-ejector tooth is perpendicular to a lever handle, the pressure bar-ejector tooth assembly upper portion, and the pressure bar-ejector tooth assembly lower portion;

the lever handle operatively connected to the pressure bar-ejector tooth assembly and the ejector mounting base;

a first cam operative to convert an input force received at the lever handle into the insertion force; and a second cam operative to convert the input force received at the lever handle into the insertion force, the first cam and the second cam being offset from a center of the front side of the line card by equal amounts, wherein the first cam is located proximate a top edge of the line card and the second cam is located proximate a bottom edge of the line card.

16. The apparatus of claim 15, wherein the lever handle comprises a surface, the surface defining at least one opening operative to allow heat to be dissipated from the line card.

17. The apparatus of claim 15, wherein the input force has a range from about 10 pounds to about 20 pounds and the insertion force has a range from about 400 pounds to about 500 pounds.

18. The apparatus of claim 17, wherein the lever handle has a length less than 11 inches.

19. The apparatus of claim 15, wherein the pressure bar-ejector tooth is configured to apply the insertion force without causing a moment about the line card.

20. The apparatus of claim 15, further comprising a torsion spring operatively connected to the lever handle and the ejector mounting base.

21. The apparatus of claim 15, wherein the lever handle is configured to operate as a heat sink for the line card.

22. The apparatus of claim 15, wherein the lever handle does not protrude from the system chassis when the line card is installed in the system chassis.

23. A method comprising:
providing a high insertion force ejector, the high insertion force ejector comprising a lever handle and a pressure bar-ejector tooth assembly having a pressure bar-ejector tooth being substantial perpendicular to the lever handle, a pressure bar-ejector tooth attached to an end of the pressure bar-ejector tooth assembly upper portion and to an end of the pressure bar-ejector tooth assembly lower portion, wherein the pressure bar-ejector tooth assembly upper portion and the pressure bar-ejector tooth assembly lower portion are spaced apart, wherein the pressure bar-ejector tooth continuously extends from beyond an end of the pressure bar-ejector tooth assembly upper portion to beyond an end of the pressure bar-ejector tooth assembly lower portion, the lever handle connected to the pressure bar-ejector tooth assembly via a first cam and a second cam, the lever handle having a length less than 11 inches, the first cam and the second cam being offset from a center of a front side of a line card by equal amounts, the first cam is located proximate a top edge of the line card and the second cam is located proximate a bottom edge of the line card, the pressure bar-ejector tooth having a height approximately equal to a height of a front side of the line card, the pressure bar-ejector tooth is perpendicular to a lever handle, the pressure bar-ejector tooth assembly upper portion, and the pressure bar-ejector tooth assembly lower portion;

receiving an input force at the lever handle; and converting, via the first cam and the second cam, the input force into an insertion force.

24. The method of claim 23, wherein receiving the input force comprises receiving a force between 10 pounds and 20 pounds.

25. The method of claim 23, wherein converting the input force into the insertion force comprise converting the input force into a force between 400 pounds and 500 pounds.

26. The method of claim 23, further comprising transferring the insertion force to a system chassis.

\* \* \* \* \*